United States Patent
Park et al.

[11] Patent Number: 6,025,575
[45] Date of Patent: Feb. 15, 2000

[54] HEATING APPARATUS FOR CHEMICAL VAPOR DEPOSITION EQUIPMENT

[75] Inventors: In Jae Park, Cheongju; Chang Jae Kim, Seoul; Jong Sik Kim, Cheongju; Dong Hyun Kang, Seoul; Seong Jae Park, Cheongju, all of Rep. of Korea

[73] Assignee: LG Semicon Co., Ltd., Cheongju, Rep. of Korea

[21] Appl. No.: 09/146,937

[22] Filed: Sep. 3, 1998

[30] Foreign Application Priority Data

Nov. 27, 1997 [KR] Rep. of Korea ............ 97 63584

[51] Int. Cl.⁷ .................. A21B 1/00; F21V 7/00; C23C 16/00
[52] U.S. Cl. .................. 219/405; 392/420; 118/725
[58] Field of Search .................. 219/405, 402, 219/391, 385, 390; 118/725; 392/820

[56] References Cited

U.S. PATENT DOCUMENTS

| | | | |
|---|---|---|---|
| 4,020,323 | 4/1977 | Dills | 219/405 |
| 4,101,759 | 7/1978 | Anthony et al. | 219/343 |
| 4,421,987 | 12/1983 | Herold | 250/492.1 |
| 4,564,744 | 1/1986 | Valentin | 219/210 |
| 4,755,654 | 7/1988 | Crowley et al. | 219/405 |
| 4,949,671 | 8/1990 | Davis et al. | 118/725 |
| 5,057,668 | 10/1991 | Gisdakis et al. | 219/390 |
| 5,536,918 | 7/1996 | Ohkase et al. | 219/390 |

*Primary Examiner*—John A. Jeffery
*Assistant Examiner*—Daniel Robinson
*Attorney, Agent, or Firm*—Fleshner & Kim

[57] ABSTRACT

A heating apparatus for chemical vapor deposition equipment which is capable of providing a uniform temperature distribution, even for a wafer having a large surface area. The heating apparatus may include upper and lower reflection plates, with a heater located between the reflection plates. The apparatus may also include a barrier plate to help provide a uniform heat distribution and to minimize dust generation and metallic pollution on a wafer. The apparatus may also include a heater cover for covering the upper portions of the first reflection plate, the heater and the barrier plate, and the sides thereof. The upper reflection plate, which is installed above the heater cover, may be integrally formed with a gas spraying means.

23 Claims, 5 Drawing Sheets

TEST : JUNE 4, 1996

| Time | Zone 1 | Zone 2 | Zone 3 | Zone 4 | Zone 5 |
|---|---|---|---|---|---|
| 08:54 | 21.6 | 21.5 | 21.5 | 21.3 | 21.4 |
| 09:50 | 61.7 | 61.9 | 61.9 | 61.7 | 61.4 |
| 10:22 | 162.7 | 164.7 | 165.2 | 163.9 | 162.8 |
| 11:34 | 182.5 | 180.8 | 180.1 | 178.6 | 179.1 |
| 11:44 | 332.5 | 333.2 | 332.4 | 336.4 | 334.8 |
| 15:34 | 315.3 | 323.5 | 323.5 | 321.7 | 319.4 |
| 16:34 | 430.6 | 445 | 441.2 | 442.4 | 434.4 |
| 17:34 | 535.4 | 557.4 | 567.9 | 552.4 | 537.2 |
| 18:34 | 611.1 | 644.2 | 657.4 | 643.6 | 614.5 |
| 19:04 | 669.7 | 713.2 | 739.6 | 702.4 | 672.9 |
| 19:24 | 701.4 | 739.6 | 758.3 | 727.2 | 704.9 |
| 19:44 | 723.2 | 757.6 | 770.6 | 743.7 | 720.8 |
| 19:58 | 745.8 | 775 | 787 | 760.6 | 749.4 |
| 20:12 | 761.8 | 776 | 776.7 | 756 | 763.7 |
| 20:27 | 814.6 | 828.6 | 834.6 | 811 | 816.1 |
| 20:37 | 809.1 | 817.3 | 821.2 | 799.3 | 810 |
| 20:57 | 798.8 | 797.9 | 800.7 | 780.9 | 787.9 |

HEATING APPARATUS FOR CHEMICAL VAPOR DEPOSITION EQUIPMENT

BACKGROUND OF THE INVENTION

1. Field of the Invention

The present invention relates to a heating apparatus for a chemical vapor deposition equipment.

2. Background of the Related Art

Known methods for heating chemical vapor deposition equipment include a lamp heating method, a method of using an integration type heater, and a method of using a susceptor that generates infrared or high frequency electromagnetic radiation.

The lamp heating methods may have heating regions divided into zones. A plurality of lamps (generally, 10–20 lamps), each of which corresponds to a zone, are spaced-apart at a regular interval, thus obtaining a desired temperature.

In direct resistance heating methods, the above-described integration type heater is used. In this method, electric power is supplied to terminals of a heater to obtain a desired heat.

In methods in which infrared or high frequency radiation is used, a particular gas is charged in a lamp, thus obtaining a desired heat using the light which is generated when the gas is charged in the lamp.

FIG. 1 shows a known heating device of a chemical vapor deposition apparatus. In FIG. 1, reference numeral 2 denotes a quartz plate, 3 denotes a wafer, and 4 denotes an Au-coating.

Some heating devices for chemical vapor deposition equipment require significant amounts of time to perform heating and cooling operations. For example, in the case of infrared or high frequency radiation heating, as shown in FIG. 2, the time required to increase the temperature of a wafer from room temperature to a predetermined high temperature is 10–15 minutes, and the time required to reduce the temperature is 60–120 minutes. Thus, much time is required, heat loss is increased, and the apparatus is inefficiently operated, and is non-economical.

In the case of a lamp heating method, which is an indirect heating method, as shown in FIG. 2, the time required to increase the temperature is 10–30 seconds, and the time required to reduce the temperature is 1–5 minutes. Although the lamp heating method provides quicker temperature increase and decrease times, the use of heating lamps also causes the temperature of a deposited metallic layer and the underlying silicon layer to be different. Therefore, when heating a large diameter wafer, it is impossible to obtain a uniform temperature distribution, and to properly control the temperature.

SUMMARY OF THE INVENTION

Accordingly, it is an object of the present invention to provide a heating apparatus for chemical vapor deposition equipment which overcomes the aforementioned problems encountered in the background art. It is another object of the present invention to provide a heating apparatus for chemical vapor deposition equipment which is capable of providing a uniform temperature distribution, even for a wafer having a large surface area.

A heating apparatus embodying the present invention may include a quartz plate, a first reflection plate, a heater including a heat radiating member installed above the first reflection plate, and a heater cover for covering the upper portions and sides of the first reflection plate, the heater and the quartz plate. The device may also include a second reflection plate installed above the heater cover. In some embodiments, the second reflection plate may be integrally formed with a gas spraying means. The apparatus is capable of forming a uniform heat distribution and is capable of minimizing dust generation and metallic pollution on a wafer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

A heating apparatus for a chemical vapor deposition equipment according to the present invention will now be explained with reference to the accompanying drawings.

Figure 1:
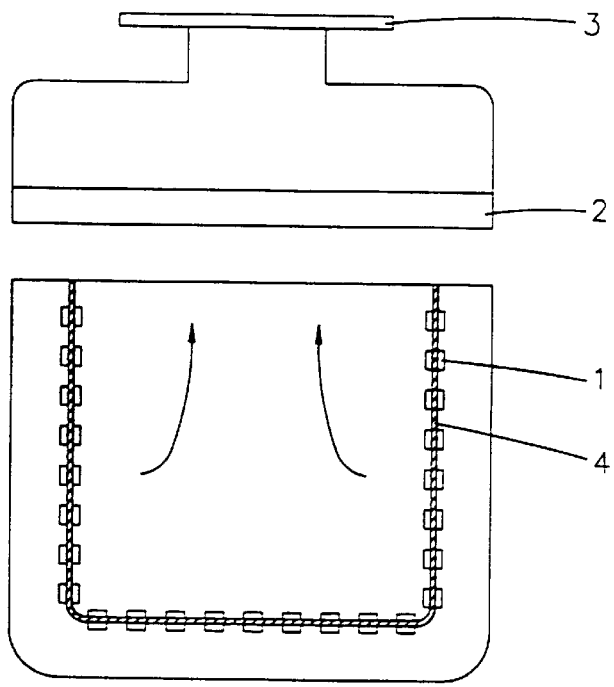
FIG. 1 is a cross-sectional view illustrating a background art heating apparatus for chemical vapor deposition equipment that uses a lamp heating method.
Figure 2:
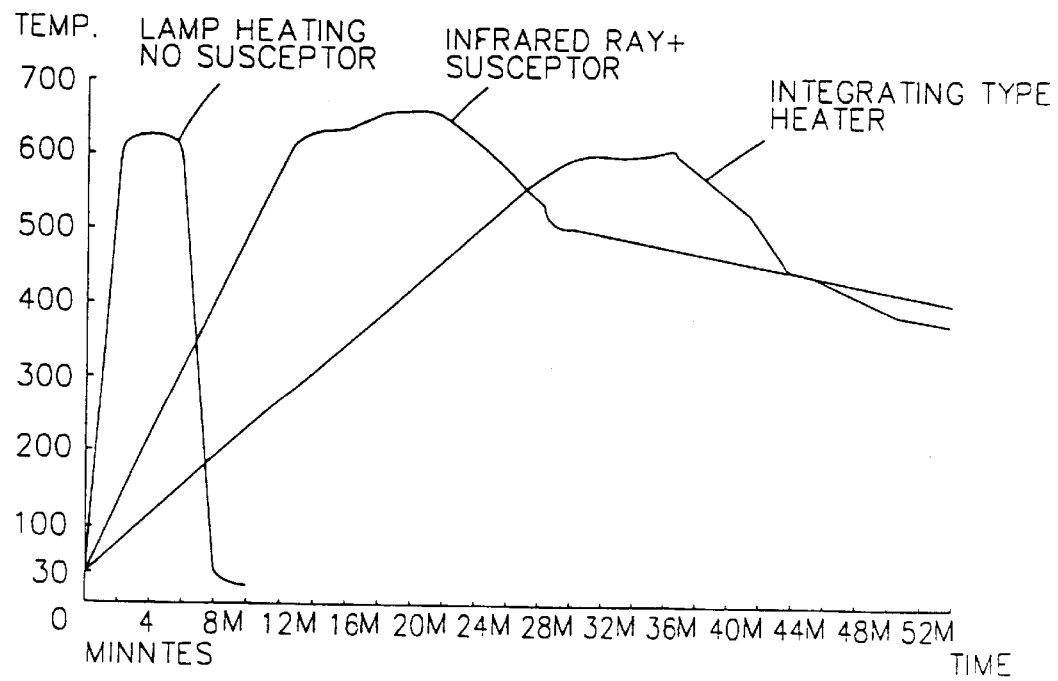
FIG. 2 is a graph illustrating temperature cycles in various background art heating devices.
Figure 3:
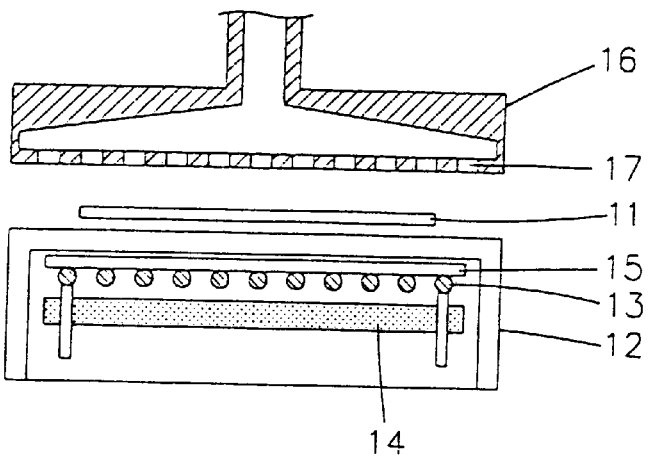
FIG. 3 is a schematic view illustrating a heating apparatus for a chemical vapor deposition equipment according to the present invention.
Figure 4:
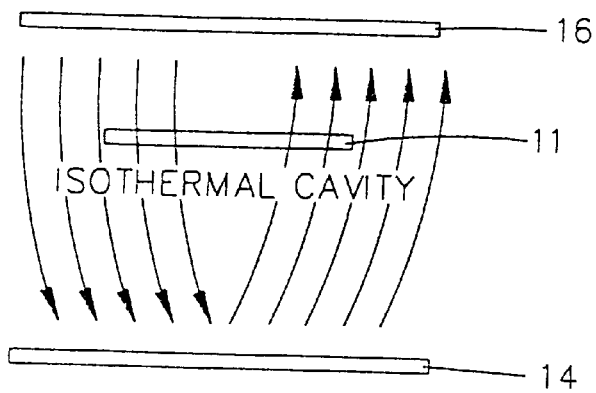
FIG. 4 is a graph illustrating the effect of reflection plates of a device embodying the present invention.
Figure 5:
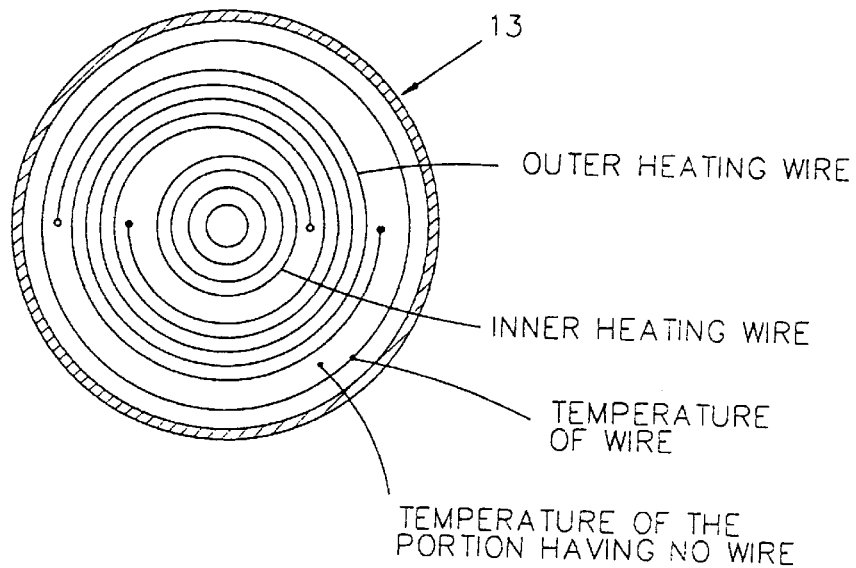
FIG. 5 is a plan view illustrating a coil of a heater embodying the present invention.

As shown in FIGS. 3 and 4, a heater cover 12 surrounds a heater 13, as shown in greater detail in FIG. 5. The heater 13 may include a coil made of a kanthal material or a super kanthal material. A quartz plate 15 is installed between the heater 13 and the heater cover 12 for fixing the position of the heater 13 and for uniformly distributing the heat generated by the heater 13. Since the heater cover 12 is made of quartz, and the heater cover 12 covers the heater 13, it is possible to prevent particles of heavy metals, etc. from being transferred from the heater 13 to a process chamber.

In addition, a lower (first) reflection plate 14 is installed below the heater 13 for blocking light and heat that emanate downwardly and laterally from the heater 13. The lower reflection plate 14 reflects the heat from the heater 13 in a predetermined direction. One or more thermocouples (not shown) may be installed between the heater 13 and the lower (first) reflection plate 14 for measuring temperatures at different regions of the heater 13.

An upper (second) reflection plate 16 made of a stainless steel is installed above the wafer 11 for reflecting heat. The upper (second) reflection plate 16 includes a gas shower head 17 for spraying and depositing gases on the wafer 11.

In a heating apparatus for chemical vapor deposition equipment according to the present invention, a heater 13 which is capable of generating a predetermined wavelength ray, such as a short wavelength infrared ray or a visible spectrum wavelength ray, is used so that a crystal structure which determines the characteristic of a ferro-dielectric is not destroyed. In addition, the lower (first) reflection plate 14 supports the heater 13, and reflects thermal energy in the infrared and visible light regions from the heater 13 to the wafer 11.

The operation of a heating apparatus according to the present invention will now be explained with reference to the accompanying drawings.

Infrared rays and visible rays generated by the heater 13 are supplied to the wafer 11 directly, and via the lower (first) reflection plate 14, and the upper (second) reflection plate 16. The infrared rays and visible rays generated by the heater 13 may be reflected back and forth between the upper (second) reflection plate 16 and the lower (first) reflection plate 14 without being transferred to the outside, so that a uniform heat field, as shown in FIG. 4, is formed between the upper and lower reflection plates 16, 14. Thus a process chamber is formed, and a ferro-dielectric film may be deposited on the wafer 11. Unlike background art lamp heating methods, in which the temperatures of the metallic layer and the silicon layer are different, in the present invention, it is possible to uniformly heat irrespective of the shape and material characteristics of the heated object.

The infrared ray heating efficiency of the wafer 11 is determined by the absorption of the light. It is possible to obtain desired heating characteristics because light may be unlimitedly reflected between the upper and lower reflection plates. In addition, since the upper (second) reflection plate 16 is integrally formed with the gas shower head 17, by which a gas is supplied for a chemical vapor deposition, it is possible to uniformly supply gas to a heat field.

Figure 6:
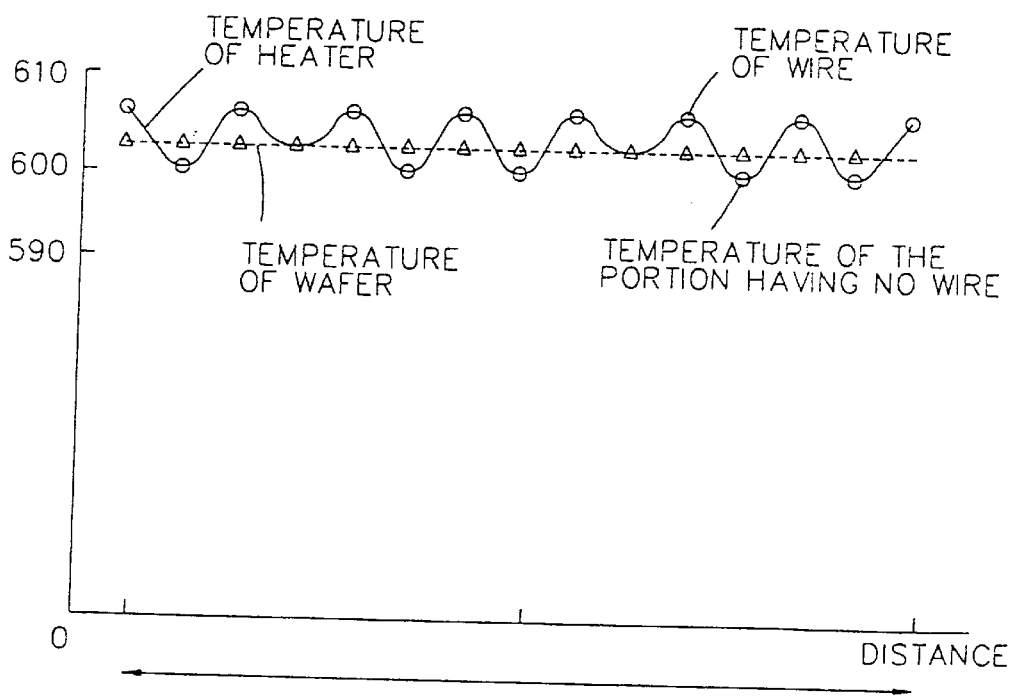
FIG. 6 is a graph illustrating a temperature distribution of a wafer and a heater, when the wafer was heated according to the present invention.
Figures 8A, 8B:
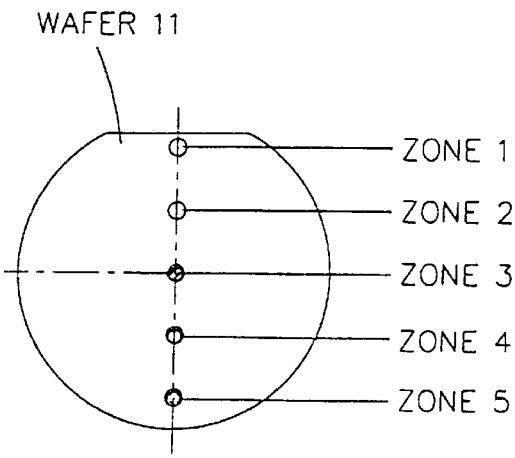
FIG. 8A is a diagram showing different zones of a wafer.
FIG. 8B is a table illustrating temperatures in different zones of a wafer heated with a heating apparatus for a chemical vapor deposition equipment embodying the present invention.

The table in FIG. 8B indicates the temperatures at different zones of a wafer, as shown in FIG. 8A, as the wafer is heated with an embodiment of the present invention. FIG. 6 graphically shows the temperature distribution of a heater and a wafer, at a particular point in time, as the wafer is being heated with an apparatus embodying the invention. As seen in FIGS. 6 and 8B, there is very little difference in temperature between the different zones.

Since the quartz plate 15 is provided above the heater 13, heat from the heater 13 is uniformly distributed. Thus, even a wafer having a large surface area can be uniformly heated.

Figure 7:
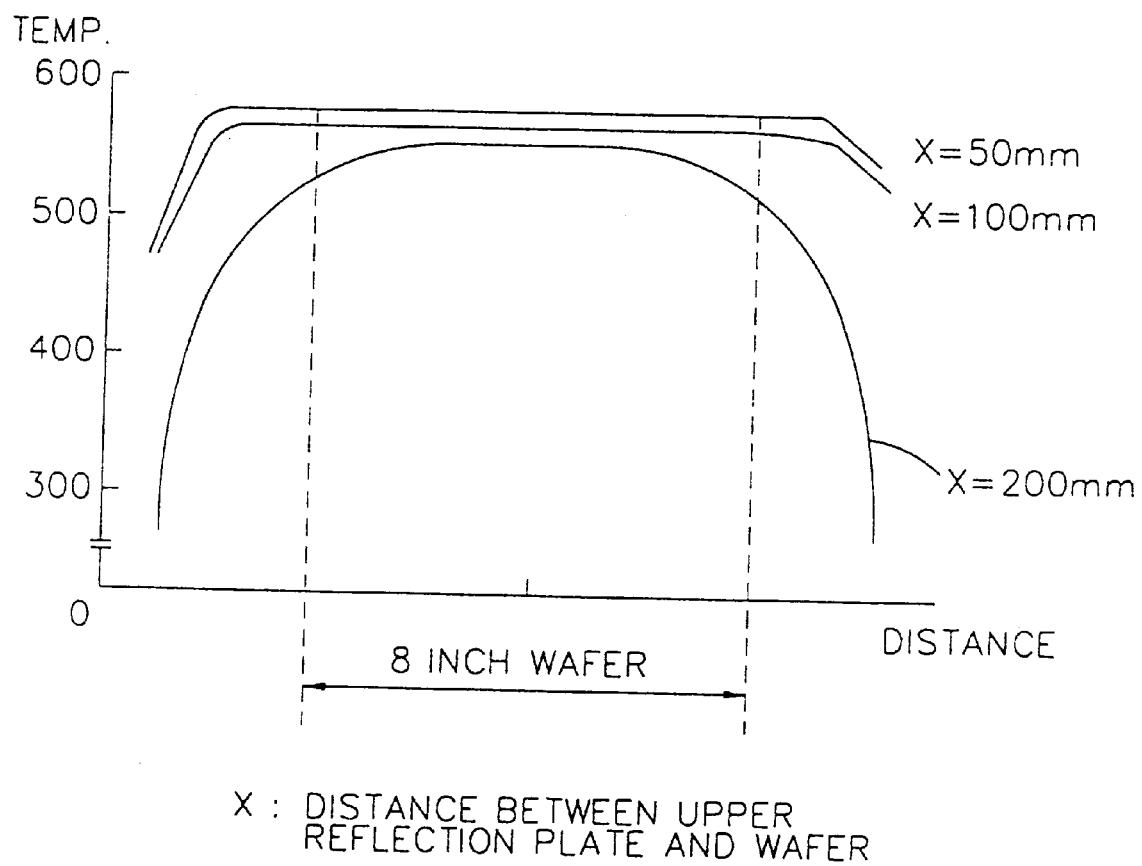
FIG. 7 shows the temperature distribution of a wafer heated according to the present invention for various separation distances between the upper reflection plate and the wafer.

FIG. 7 shows temperature distributions of a wafer heated with an apparatus embodying the present invention for various separation distances between the wafer and the upper reflection plate. As shown in FIG. 7, the temperature of the center portion of the wafer is almost uniform when the wafer is heated with an apparatus embodying the present invention.

In addition, dust or foreign materials are blocked from traveling from the heater to the wafer 11 by the quartz plate 15 and the heater cover 12. Also, an oxidation of the heater 13 is prevented under the oxygen environment.

Furthermore, when growing a film using an apparatus embodying the invention, it is possible to quickly increase or decrease the temperature of the wafer and film. Since the temperature setting time is not extended due to temperature overshoots during the heating operation, the crystal structure which determines the characteristics of the ferrodielectric is not destroyed.

In another embodiment of the present invention, it is possible to obtain an optimum thin film growth by varying the film uniformity and heat uniformity by moving the upper (second) and lower (first) reflection plates 16 and 14 in the upward, downward, leftward and rightward directions.

When using a heating apparatus for chemical vapor deposition equipment according to the present invention, the wafer material to be heated may be selected from a wider range of materials than was possible with background art heater systems. This is because the uniform heat field generated by the present invention ensures that the temperature throughout the material is substantially identical, which allows film formation processes to proceed at a lower temperature.

A good heat efficiency is enabled by the present invention. For example, if the temperature of the object to be heated is 600° C., the surface temperature of the heater is about 630° C., and the heat loss is very small. In the background art, when the temperature of the object to be heated is 600°, the surface temperature of the heater is 1300°–1800° C. Therefore, much heat loss occurs in the background art, compared to the present invention.

In addition, in a background art lamp heating apparatus, a small amount of pollution material may affect the temperature distribution. However, in the present invention, pollution materials are blocked from being transferred into the apparatus by the quartz plate and heater cover.

Furthermore, the structure of an apparatus embodying the invention is simple and economical, so that it is possible to easily heat a predetermined object element.

The foregoing embodiments are merely exemplary and are not to be construed as limiting the present invention. The present teaching can be readily applied to other types of devices. The description of the present invention is intended to be illustrative, and not to limit the scope of the claims. Many alternatives, modifications, and variations will be apparent to those skilled in the art.

What is claimed is:

1. A heating apparatus for a chemical vapor deposition equipment, comprising:
   a first reflection plate;
   a heater configured to conduct a chemical vapor deposition process installed above the first reflection plate;
   a second reflection plate installed above the heater; and
   a heater cover for covering upper portions of the first reflection plate, and upper and side portions of the heater.

2. The apparatus of claim 1, wherein said heater cover is made of quartz.

3. The apparatus of claim 1, wherein said heater includes a coil.

4. The apparatus of claim 3, wherein said coil is made of a kanthal material.

5. The apparatus of claim 3, wherein said coil is made of a super-kanthal material.

6. The apparatus of claim 1, further comprising a barrier plate installed above the heater.

7. The apparatus of claim 6, wherein said barrier plate is made of quartz.

8. The apparatus of claim 1, wherein at least one of said first and second reflection plates is made of stainless steel.

9. The apparatus of claim 1, wherein the first and second reflection plates are installed so that radiant energy generated by the heater is reflected between the first and second reflection plates.

10. The apparatus of claim 1, wherein at least one of said first and second reflection plates is movable in at least one of upward, downward, and lateral directions.

11. The apparatus of claim 1, wherein a width of said first reflection plate is substantially the same as a width of said second reflection plate.

12. The apparatus of claim 1, wherein the second reflection plate is integrally formed with a gas delivery device.

13. The apparatus of claim 12, wherein the gas delivery device is a spray head.

14. A heating apparatus for chemical vapor deposition equipment, comprising:
- first reflection means for reflecting radiant energy toward a substrate holding area;
- second reflection means for reflecting radiant energy toward the substrate holding area;
- heating means configured to conduct a chemical vapor deposition process, located between the first and second reflection means, for heating a substrate placed in the substrate holding area; and
- a heater cover configured to cover upper portions of the first reflection means and upper and side portions of the heating means.

15. The apparatus of claim 14, further comprising:
- barrier means for blocking particles from the heating means from entering the substrate holding area.

16. The apparatus of claim 15, wherein at least a portion of the barrier means is located between the heating means and the substrate holding area.

17. The apparatus of claim 14, further comprising delivery means for delivering a gas to the substrate holding area.

18. The apparatus of claim 17, wherein the delivery means and the second reflection means are integrally formed in a single component.

19. The apparatus of claim 14, wherein the first reflection means and the second reflection means are located on opposite sides of the substrate holding area so that radiant energy may be reflected back and forth between the first and second reflection means.

20. The apparatus of claim 14, wherein at least one of the first reflection means and the second reflection means is capable of moving at least one of upward, downward and laterally with respect to the substrate holding area.

21. The apparatus of claim 1, wherein at least one of said first and second reflection plates is movable in a vertical or horizontal plane such that said first and second plates remain parallel to each other.

22. The apparatus of claim 13, wherein the spray head has a plurality of apertures distributed over a face of the spray head such that a gas can be substantially evenly sprayed over a substrate holding area of the apparatus.

23. The apparatus of claim 13, wherein the delivery means is configured to spray a gas substantially evenly over a substrate holding area.

* * * * *